US008821129B2

(12) United States Patent
Heli et al.

(10) Patent No.: US 8,821,129 B2
(45) Date of Patent: Sep. 2, 2014

(54) FAN UNIT FOR FILTER FANS

(75) Inventors: Thomas Heli, Langenburg (DE); Joerg Guenther, Doerzbach (DE); Walter Hofmann, Mulfingen (DE)

(73) Assignee: ebm-papst Mulfingen GmbH & Co. KG, Mulfingen (DE)

( * ) Notice: Subject to any disclaimer, the term of this patent is extended or adjusted under 35 U.S.C. 154(b) by 389 days.

(21) Appl. No.: 12/971,119

(22) Filed: Dec. 17, 2010

(65) Prior Publication Data

US 2011/0150632 A1   Jun. 23, 2011

(30) Foreign Application Priority Data

Dec. 22, 2009  (DE) .................. 20 2009 017 511 U

(51) Int. Cl.
| | |
|---|---|
| *F04D 25/08* | (2006.01) |
| *F04D 29/70* | (2006.01) |
| *B01D 46/00* | (2006.01) |
| *F04D 29/52* | (2006.01) |
| *F04D 29/64* | (2006.01) |
| *H05K 7/20* | (2006.01) |
| *H02B 1/56* | (2006.01) |

(52) U.S. Cl.
CPC .......... *B01D 46/001* (2013.01); *B01D 2273/30* (2013.01); *H02B 1/565* (2013.01); *F04D 29/703* (2013.01); *F04D 29/526* (2013.01); *B01D 2265/022* (2013.01); *F04D 29/646* (2013.01); *F04D 25/08* (2013.01); *H05K 7/20181* (2013.01); *B01D 2279/45* (2013.01); *F04D 29/701* (2013.01)
USPC ................................................... 416/247 R

(58) Field of Classification Search
CPC ....................................................... F24F 7/013

USPC ............. 416/174, 177, 179, 185, 188, 247 R
See application file for complete search history.

(56) References Cited

U.S. PATENT DOCUMENTS

| 3,644,066 | A | * | 2/1972 | Heob et al. ..................... 417/354 |
|---|---|---|---|---|
| 4,636,669 | A | * | 1/1987 | Plunkett et al. ................. 310/51 |

(Continued)

FOREIGN PATENT DOCUMENTS

| EP | 0352113 A2 | 1/1990 |
|---|---|---|
| EP | 1156224 A2 | 11/2001 |

(Continued)

*Primary Examiner* — Edward Look
*Assistant Examiner* — Eldon Brockman
(74) *Attorney, Agent, or Firm* — Brinks Gilson & Lione

(57) ABSTRACT

A fan unit (1), to be attached to a filter frame (40) of a filter fan, consisting of a housing with a cylindrical housing rim, an inlet opening (20), an outflow opening (7) and at least one protective grid which covers one of both of the openings, and one fan (4) attached to the housing via a motor mount (14) which conveys the air in at least the axial direction. The design enabling the manufacture of a more compact fan unit in an easier and more cost-effective manner, which provides high efficiency and can be installed as a suction as well as a blowing fan unit in the filter fan, and is easy to dismount for the maintenance of the filter fan. This is attained in that the fan unit housing is divided perpendicularly with respect to the axis (X-X) of the fan (4) in the region of the housing rim (9, 22) into two housing parts, one forming a motor bracket (2) and the other forming an air inlet part (3), which are detachably connected to one another, whereby the motor bracket (2) as well as the air inlet part (3) each integrally form a protective grid structure (8, 21).

15 Claims, 4 Drawing Sheets

(56) References Cited

U.S. PATENT DOCUMENTS

| | | | |
|---|---|---|---|
| 4,694,528 A * | 9/1987 | Comer et al. | 15/330 |
| 5,189,327 A * | 2/1993 | Ootsuka et al. | 310/71 |
| 5,304,040 A * | 4/1994 | Wang | 416/247 R |
| 5,352,094 A * | 10/1994 | Peng | 416/247 R |
| 5,407,324 A * | 4/1995 | Starnes et al. | 415/208.5 |
| 5,435,695 A * | 7/1995 | Chiu et al. | 416/244 R |
| 5,498,130 A * | 3/1996 | Wakley et al. | 415/213.1 |
| 5,584,095 A * | 12/1996 | Redding et al. | 15/411 |
| 6,059,541 A * | 5/2000 | Beckey et al. | 417/295 |
| 6,431,910 B1 * | 8/2002 | Chuang et al. | 439/577 |
| 6,554,230 B1 * | 4/2003 | Horski | 248/49 |
| 6,692,240 B1 * | 2/2004 | Leonhard et al. | 417/372 |
| 6,893,212 B2 * | 5/2005 | Galassi | 415/121.2 |
| 7,220,355 B2 * | 5/2007 | Palmer et al. | 210/416.1 |
| 7,405,934 B2 * | 7/2008 | Otsuki et al. | 361/697 |
| 7,494,408 B2 * | 2/2009 | Chen et al. | 454/184 |
| 7,495,910 B2 * | 2/2009 | Yang | 361/695 |
| 2003/0163905 A1 * | 9/2003 | Rubenstein et al. | 24/453 |
| 2005/0186070 A1 * | 8/2005 | Zeng et al. | 415/211.2 |
| 2006/0279927 A1 * | 12/2006 | Strohm | 361/695 |
| 2006/0292010 A1 * | 12/2006 | Holston et al. | 416/244 R |
| 2008/0131283 A1 * | 6/2008 | Elsaesser et al. | 416/247 R |
| 2009/0092499 A1 * | 4/2009 | Barker | 416/247 R |
| 2009/0191054 A1 * | 7/2009 | Winkler | 415/215.1 |

FOREIGN PATENT DOCUMENTS

| | | |
|---|---|---|
| EP | 1930601 A2 | 6/2008 |
| EP | 1967743 A2 | 9/2008 |
| EP | 2045473 A1 * | 4/2009 |
| WO | WO 2008/075872 A1 | 6/2008 |

* cited by examiner

FAN UNIT FOR FILTER FANS

CROSS REFERENCE TO RELATED APPLICATION

This application claims priority to German Patent Application No. DE 20 2009 017 511.1, filed Dec. 22, 2009.

FIELD OF THE INVENTION

The invention relates to a fan unit, in particular of type to be attached to a filter frame of a filter fan, consisting of a housing with a cylindrical housing rim, an inlet opening, an outflow opening and at least one protective grid which covers one of both openings, and one fan attached to the housing by means of a motor mount which conveys the air in at least the axial direction.

BACKGROUND OF THE INVENTION

Fan units of the above referenced kind are used as a part of a filter fan for industrial installations such as control panels. The fan units can be configured as a blowing fan unit as well as a suction fan unit. The known fan units for fan filters normally have an axial fan wheel as a flow drive of the fan unit and are screwed to the filter frame of the filter fan via a mounting flange of the fan unit housing. A protective grid is screwed to the fan unit housing as a protection of the fan unit. The disadvantage of such fan units is that they have a large overall height and are expensive to manufacture. In addition, they have to be mounted on the filter frame in several work steps with tools, and changing the conveying direction is only possible by means of an expensive mounting procedure. During maintenance of the filter fan, the fan unit, as well as the protective grid has to be dismounted and again mounted afterward.

The object of the invention is to provide a solution which allows the manufacture of a more compact fan unit in an easier and less expensive way, which provides high efficiency and is particularly easy to install in the filter fan as a blowing as well as a suction fan unit, and which can be dismounted for the maintenance of the filter fan in a particularly easy way.

SUMMARY OF THE INVENTION

For a fan unit of the above described type, the object is attained according to the present invention in that the housing is divided perpendicularly with respect to the axis of the fan wheel in the region of the housing rim into at least two housing parts, the motor bracket and the air inlet part, which are connected to one another, whereby the motor bracket as well as the air inlet part each form an integral protective grid structure. It is particularly advantageous if the protective grid structure of the motor bracket has a motor mount with fastening elements for attaching the fan. The division of the housing into two halves together with the integral configuration allows a particularly easy installation of the fan in the fan unit housing. In addition, the housing and the fan unit are thus easy and cost-effective to manufacture, and the fan unit can have a particularly compact construction.

In one of the embodiments, at least one mounting flange is configured with fastening elements on the circumference of the motor bracket and on the circumference of the air inlet part. The fastening elements of the fan unit preferably consist of several keyhole-shaped bayonet openings, and the fastening elements of the filter frame consist of respectively matching mushroom-shaped fastening knobs, whereby the fastening elements of the fan unit and of the filter frame form a bayonet lock. The fastening elements of the mounting flange additionally have a snap-in hole with an unlocking knob applied to the snap-in hole via a radial bar, and the fastening elements of the filter frame have at least one snap-in hook applied to one of the mounting rims of the filter frame. This has the advantage that the fan unit can be mounted without tools, and that the fan unit can be mounted on and dismounted from the filter frame in a particularly easy and secure manner.

Furthermore, in one of the embodiments of the invention the fan wheel of the fan is configured as a diagonal fan wheel, and in the outer radial area one or both protective grid structure(s) are configured as outward pointing holding struts inclined obliquely with respect to the axis of the fan, so that one or both protective grid structure(s) are configured in a plate-shape, and the bottom of the plate protrudes outward from the opening of the housing covered by the protective grid structure. In this case, it is particularly advantageous if the diameter of the outflow opening matches the diameter of the housing rim of the motor bracket, and the diameter of the inlet opening is smaller than the diameter of the cylindrical housing rim of the air inlet part. This embodiment has the advantage that a minimum resistance to the air flow is afforded in the outflow direction and/or in the suction direction of the fan, and the air flow and the efficiency of the fan unit are improved.

In another embodiment of the invention the motor bracket and air inlet part respectively have a lateral open connector housing on the circumference of the respective housing rim, or alternatively on the respective mounting flange for receiving a plug connection of the fan unit, whereby a connector receptacle is arranged inside the connector housing formed by the connector housing parts. This allows an easy connection of the electrical terminal connections and optional additional capacitors to the plug connection of the fan unit and allows the fan unit to be easily mounted. In this case, it is particularly advantageous if the motor bracket as well as the air inlet part have four mounting flanges equally distributed at 90° angles around the circumference, so that the fan unit can be variably mounted on the filter frame in four different positions, and the position of the connector housing can be adapted to the spatial relations of the filter fan or of the environment.

The components mentioned above as well as claimed and described in the exemplary embodiments to be used according to the present invention are not subject to specific conditions with reference to their size, shape, configuration, selection of materials and technical conception. Thus, the criteria of selection known in the field of application can be used without restriction.

Further details, characteristics and advantageous embodiments of the invention will be apparent from the following description and are explained in more detail with reference to several exemplary embodiments in the figures, as well as from the dependent claims.

BRIEF DESCRIPTION OF THE DRAWINGS

Similar characteristics of the different figures are provided with the same reference numerals.

DETAILED DESCRIPTION OF THE INVENTION

Figure 1:
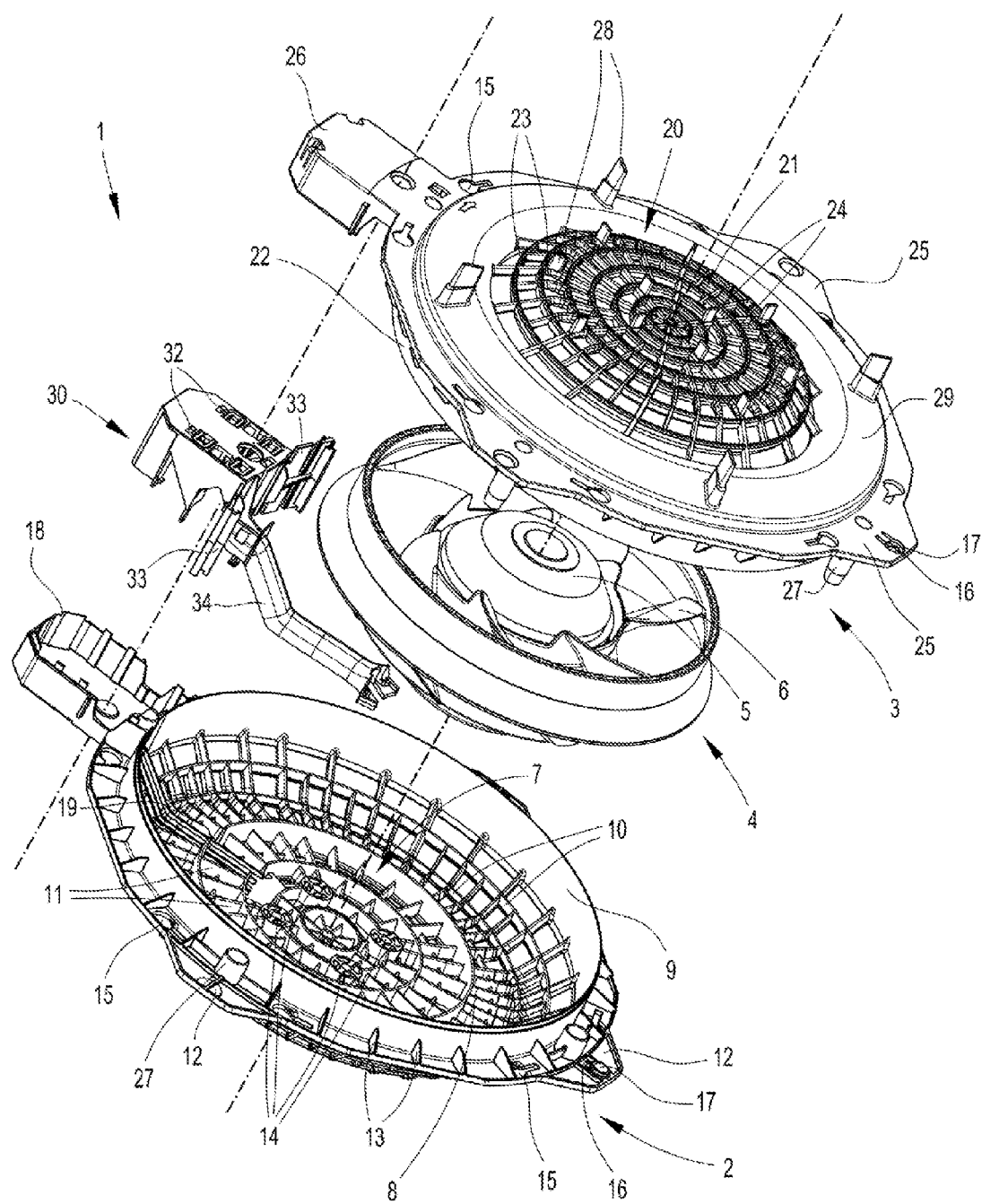
FIG. 1 is an exploded drawing of a fan unit according to the present invention with a view of the inlet opening.
Figure 2:
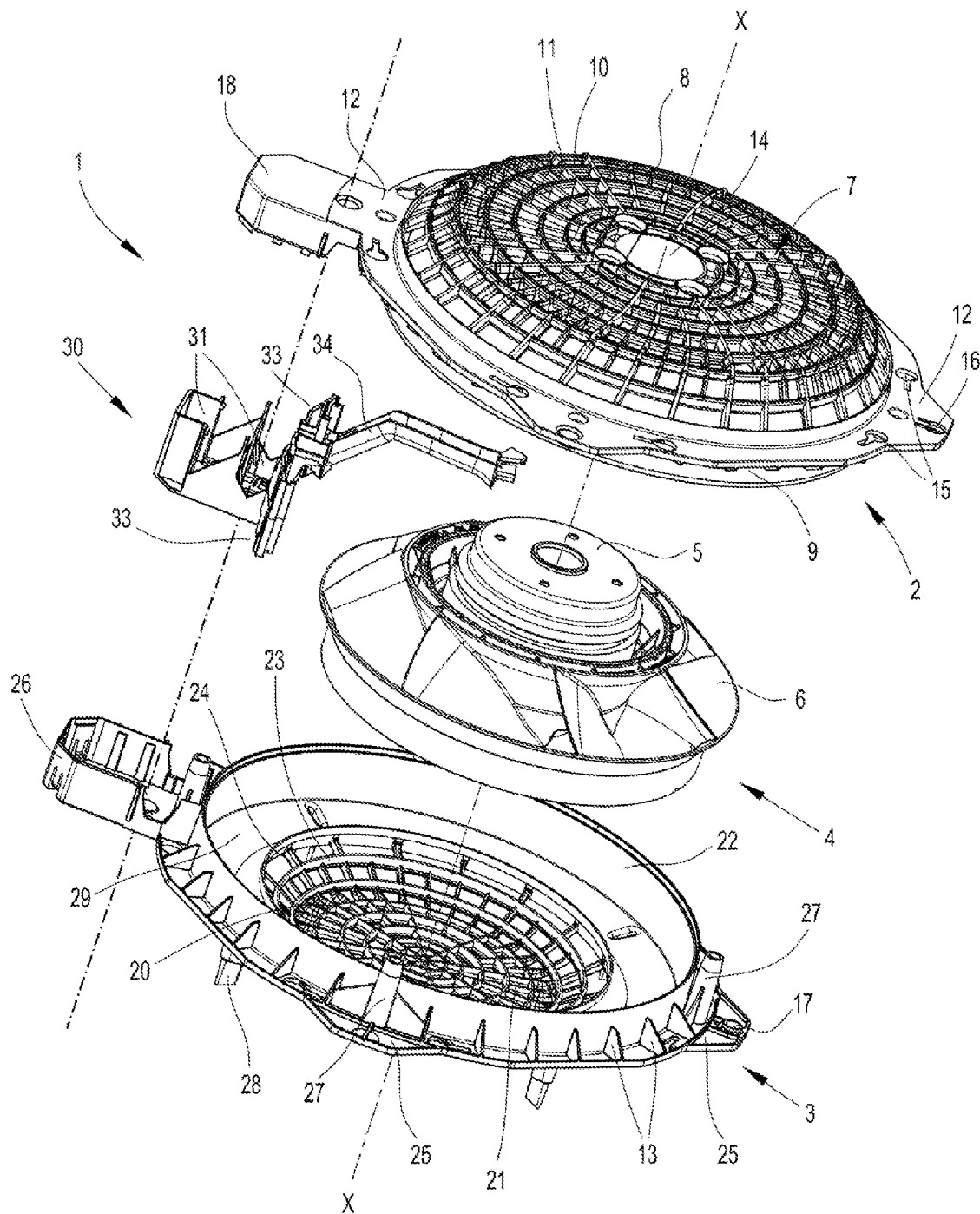
FIG. 2 is an exploded drawing of a fan unit according to the present invention with a view of the outflow opening.
Figure 3:
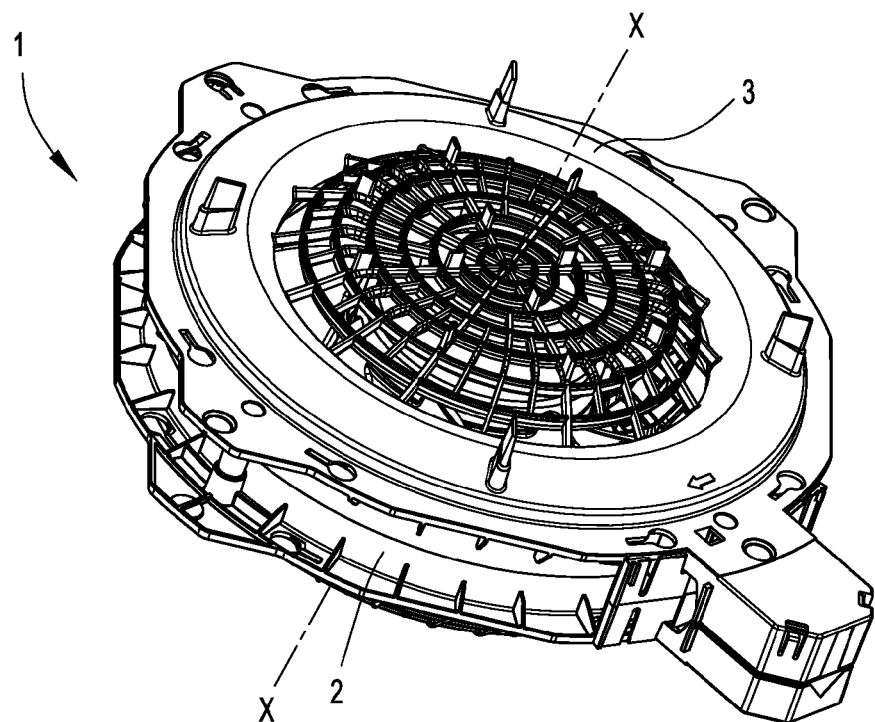
FIG. 3 shows an assembled fan unit according to the present invention with a view of the inlet opening.
Figure 4:
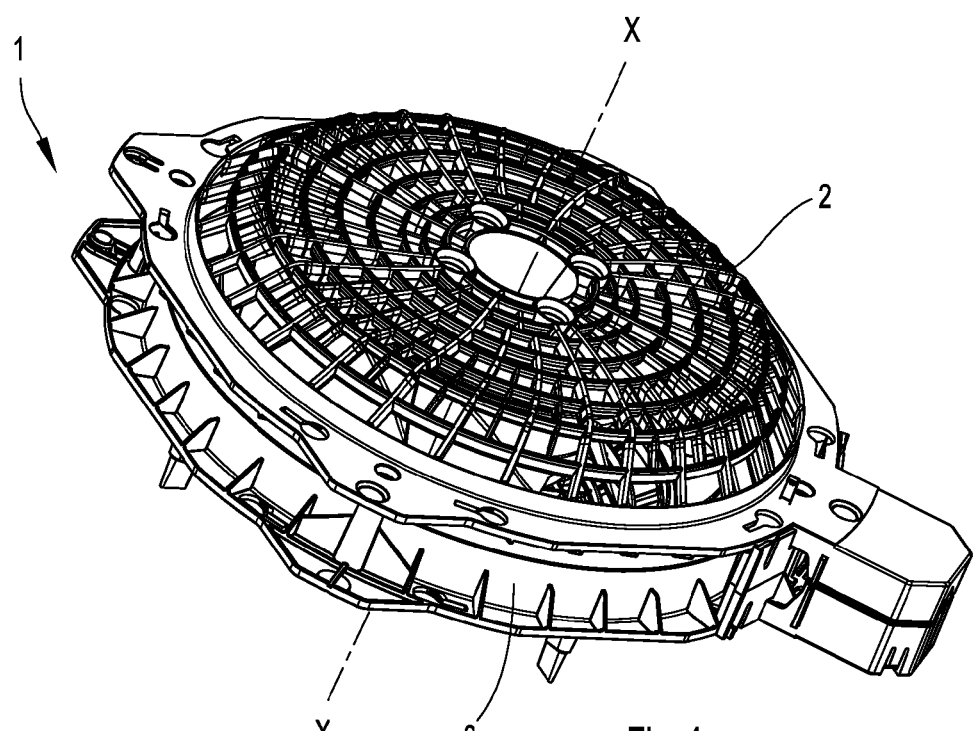
FIG. 4 shows an assembled fan unit according to the present invention with a view of the outflow opening.

An embodiment of a fan unit according to the present invention is shown in FIG. 1, FIG. 2, FIG. 3, and FIG. 4. The fan unit 1 has a two-part housing which consists of a motor bracket 2 and an air inlet part 3. A fan 4 is also mounted in the housing. The fan 4 consists of a preferably electronically controlled electric motor 5, in particular of an external rotor motor, with a fan wheel 6 attached to the rotor of the electric motor 5, in particular a diagonal fan wheel or an axial fan wheel.

The motor bracket 2 is preferably configured as a single part and is preferably made of plastic material. It has an outflow opening 7 which is completely covered by a plate-shaped protective grid structure 8 basically running perpendicularly to the axis X-X of the fan 4. A tubular housing rim 9 joins the edge of the outflow opening 7 forming the lateral wall of the motor bracket 2 and running inward parallel to the axis X-X of the fan 4 in the direction of the air inlet part 3. The diameter of the outflow opening 7 matches the diameter of the housing rim 9.

The protective grid structure 8 is formed by several ring-shaped circumferential protective struts 10 which are connected to one another at intersection points, and by radial holding struts 11, whereby both types of strut have a holding as well as protective function and are configured for the best flow efficiency. In the outer radial region of the protective grid structure 8, the plate shape is formed by outward pointing holding struts 11 that are inclined obliquely with respect to the axis X-X in order to offer minimum resistance in the outflow direction of the air flow, which is in particular generated by a diagonal fan wheel. A motor mount 14 with fastening elements, in particular through-openings, is preferably provided centrally in the protective grid structure 8 for attaching the fan 4.

In addition, a circumferential mounting flange 12 or at least two protruding mounting flanges 12 are applied to the outer edge of the outflow opening 7, which are equally distributed around the circumference and run perpendicularly to the housing rim 9. In order to reinforce the mounting flange 12, supporting rims 13 are applied perpendicularly to the mounting flanges 12 and tangentially to the housing rim 9 on the inner side facing the air inlet part 3 which additionally connect and support the mounting flange 12 with the housing rim 9.

Figure 5:
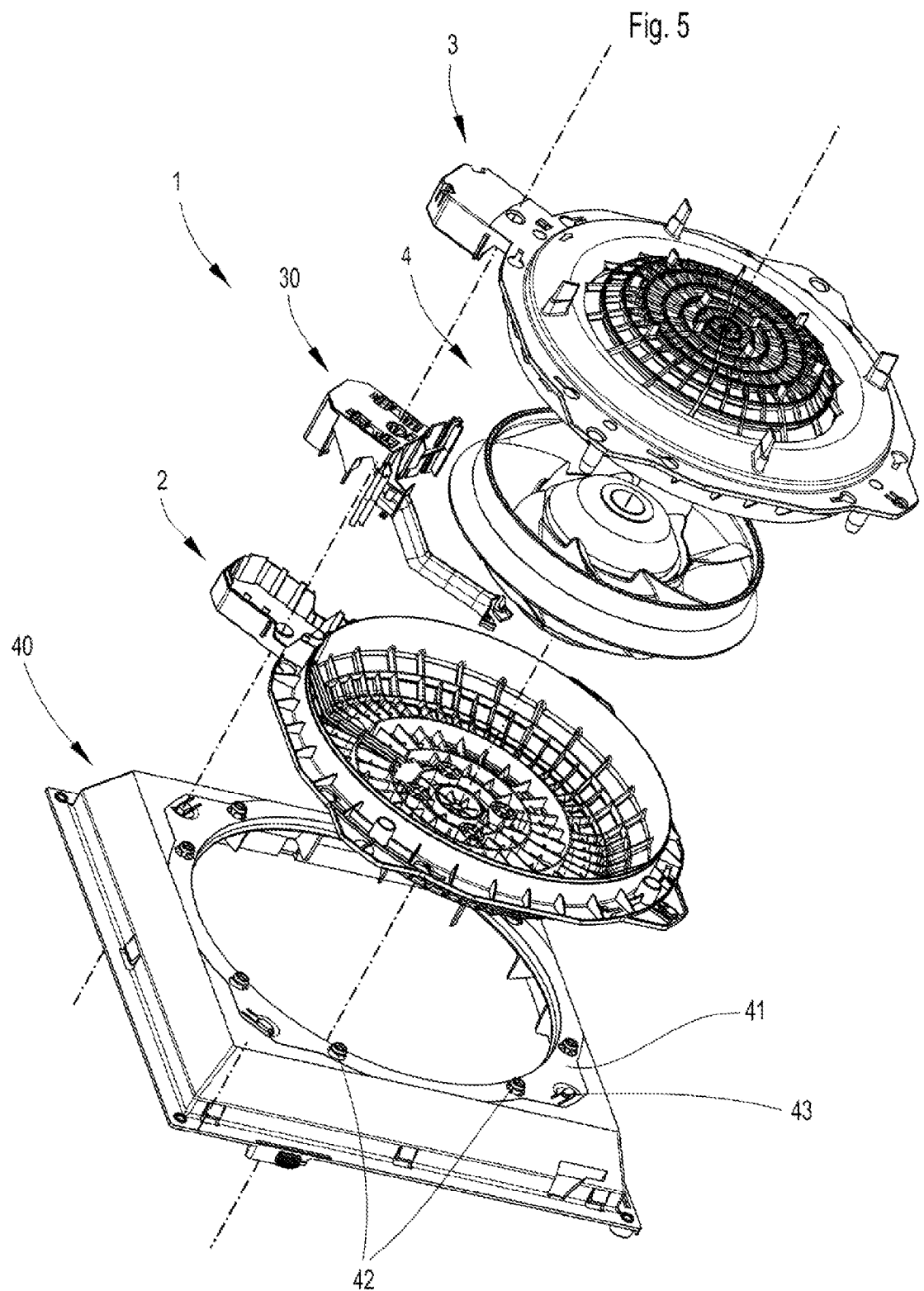
FIG. 5 is an exploded drawing of a fan unit according to the present invention with a filter frame with a view of the inlet opening.

The mounting flanges 12 are provided with fastening elements, in particular fastening elements for a bayonet lock or through-openings for screw fixation, which are used for attaching, in particular without tools, the fan unit 1 to a filter frame 40 shown in FIG. 5. The fastening elements can in particular consist of at least one keyhole-shaped bayonet opening 15. At least one snap-in hole 16 and preferably one unlocking knob 17 applied to the snap-in hole and connected to the mounting flange 12 on one side can additionally be provided.

Furthermore, on one side the motor bracket 2 has an open connector housing part 18 applied to the housing rim 9, or alternatively is applied to the mounting flange 12 for mounting a plug connection, which is not shown, of the fan unit 1, and optionally of a capacitor, which is not shown. A U-shaped channel 19 additionally runs radially in the inner side of the protective grid structure 8 from the motor mount 14 to the connector housing part 18 which is used for receiving a connection line of the fan 4, which is not shown.

The air inlet part 3 is preferably configured in one part and is preferably made of plastic material. It has an inlet opening 20 which is bordered by a ring-shaped closed nozzle portion 29. The inlet opening narrows inward into the housing and is completely covered by an integrated, plate-shaped, protective grid structure 21 basically running perpendicularly with respect to the axis X-X of the fan 4. A tubular housing rim 22 joins the rim of the nozzle portion 29 forming the lateral wall of the air inlet part 3 and running inward parallel with respect to the axis X-X of the fan 4 in the direction of the motor bracket 2. The diameter of the inlet opening 20 is smaller than the diameter of the housing rim 22 as a result of the closed rim of the nozzle 29.

Alternatively, the motor bracket 2 can also have a broader housing rim 9 in the direction of the axis X-X, so that the housing rim 22 at the air inlet part 2 can be dispensed with, or conversely the air inlet parts 3 can have a broader housing rim 22 in the direction of the axis X-X, so that the housing rim 9 at the motor bracket 2 can be dispensed with.

The protective grid structure 21 of the air inlet part 3 is formed by several ring-shaped circumferential protective struts 23 which are connected to one another at intersection points, and radial holding struts 24, whereby both types of strut have a holding as well as protective function and are configured for the best flow efficiency. In the outer radial region of the protective grid structure 21, the plate shape is formed by outward pointing holding struts 24 that are inclined obliquely with respect to the axis X-X in order to offer minimum resistance in the inflow direction of the air flow which is generated, in particular, by a diagonal fan wheel.

In addition, a circumferential mounting flange 25 or at least two protruding mounting flanges 25 are applied to the outer rim of the nozzle portion 29, said flanges run perpendicularly to the housing rim 22 and are equally distributed around the circumference. In order to reinforce the mounting flange 25, supporting rims 13 are applied perpendicularly to the mounting flanges 25 and tangentially to the housing rim 22 on the inner side facing the motor bracket 2, said supporting rims additionally connect and support the mounting flange 25 with the housing rim 22.

The mounting flanges 25 are provided with fastening elements, in particular fastening elements for a bayonet lock or with through-openings for screw fixation, which are used for attaching, in particular without tools, the fan unit 1 on a filter frame 40 shown in FIG. 5. The fastening elements can likewise consist of at least one keyhole-shaped bayonet opening 15. At least one snap-in hole 16 and preferably one unlocking knob 17 mounted in the snap-in hole and connected to the mounting flange 25 on one side can additionally be arranged.

Furthermore, the air inlet part 3 has an open connector housing part 26 mounted on one side to the housing rim 22, or alternatively to one of the mounting flanges 25 for receiving a plug connection, which is not shown, of the fan unit 1, and optionally of a capacitor, which is not shown.

The motor bracket 2 and the air inlet part 3 have fastening elements at their rims equally distributed around the circumference, preferably dome-shaped screw projections 27 with tapped holes and/or through-openings to connect both parts to one another. A snap-in connection is also possible.

Dome-shaped spacers 28 are applied to the outer side of the nozzle portion 29 and to the outer surface of the holding struts and/or protective struts of the protective grid structure 21 of the air inlet part 2 which are used as abutment points for a filter, which is not shown, mounted before the inlet opening 20, thus ensuring sufficient air supply to the fan unit 1.

A plug receptacle 30 is additionally mounted in the housing of the fan unit 1. The plug receptacle 30 has pockets 31 which are provided with spring tabs 32 in order to compensate tolerances of the capacitors in this way. Two flange surfaces 33 are provided laterally on the plug receptacle 30 in order to receive the plug connector which is not shown. The plug receptacle 30 additionally has a U-shaped channel lug 34 which covers the U-shaped channel 19 of the motor bracket 2 in the mounted state of the plug receptacle 30 and thus forms a tunnel in which the connection line of the fan 4 is received, preventing thereby the connection line from touching the fan wheel 6. The plug receptacle 30 is connected to the motor bracket 2 by means of fastening elements, in particular by means of snap-in connections. In order to hold the flange surfaces 33, which receive the plug connector, the flange surfaces 33 are positively fixed behind a circumferential rim of the motor bracket 1 and of the air inlet part 3.

The mounting flange 12 of the motor bracket 2 and its fastening elements 15, 16, 17 as well as the mounting flange 25 of the air inlet part 3 and its fastening elements 15, 16, 17 are configured in a similar way, so that the fan unit 1 can be mounted either as a suction or blowing fan unit 1 by means of a 180° rotation about a central perpendicular axis with respect to the axis X-X of the fan 4 to the filter frame 40, in particular without tools and without detaching the protective grid.

In addition to the fan unit 1 according to the present invention, FIG. 5 shows a filter frame 40 with fastening elements according to the present invention. The fastening elements are applied to at least two mounting rims 41 of the filter frame 40 and each in particular consists of a mushroom-shaped fastening knob 42 applied to the mounting rims 41, and preferably at least one snap-in hook 43. The fastening knobs 42 are thus arranged such that they interact as bayonet locks together with the keyhole-shaped bayonet openings 15 of the fastening elements of the fan unit 1. The attachment of the fan unit 1 to the filter frame 40 is preferably secured against detachment by means of the snap-in hook 43, which snaps into the snap-in hole 16 of the mounting flange 12 and/or 25 of the fan unit 1 in the attached state. The snap-in hook 43 can be pressed out of the snap-in hole 16 by means of the unlocking knobs 16 of the mounting flange 12 and/or 25 of the fan unit 1.

The mounting flange 12 and/or 25 of the motor bracket 1 and/or of the air inlet part 3 and their fastening elements 15, 16, 17, and the fastening elements 42, 43 of the filter frame 40 are in particular arranged such that an attachment of the mounting flange 12 and/or 25 to the respectively opposite mounting rims 41 of the filter frame 40 is possible at a rotational angle of 90° of the fan unit 1 about the axis X-X of the fan 4. This allows installation of the plug housing formed by both plug housing parts 18 and 26 in different positions in order to adjust the fan unit 1 to the respective spatial conditions of the environment and of the filter fan.

The invention is not restricted to the illustrated and described exemplary embodiments, but also comprises all identically acting designs consistent with the invention. Furthermore, the invention is not even restricted to the combination of characteristics defined in the respective independent claims, but can also be defined by any other combination of certain characteristics of all disclosed individual characteristics. This means that basically each individual characteristic of the respective independent claims may virtually be omitted and/or replaced by at least one individual characteristic disclosed at another point of the application. To this extent, the claims are to be merely understood as a first attempt at formulating the respective invention.

While the above description constitutes the preferred embodiment of the present invention, it will be apparent that the invention is susceptible to modification, variation, and change without departing from the proper scope and fair meaning of the accompanying claims.

The invention claimed is:

1. A fan unit (1) configured to be attached to a filter frame (40) of a fan (4) with a fan axis (X-X), the fan unit being a preassembled unit comprising
    a housing with a cylindrical housing rim (22), an inlet opening (20), an outflow opening (7), and two protective grid structures (8, 21) covering the inlet opening (20) and the outflow opening (7), and
    a fan (4) attached to the housing by a motor mount (14) which conveys air in at least an axial direction parallel to the fan axis (X-X), the fan (4) having a fan wheel (6) formed as one of a diagonal fan wheel and an axial fan wheel,
    the housing being divided perpendicularly to the fan axis (X-X) in the region of the cylindrical housing rim (9, 22) into at least two detachable housing parts connected to one another, one of the housing parts forming a motor bracket (2) and the other housing part forming an air inlet part (3), each of the motor bracket (2) and the air inlet part (3) formed in one piece with one of the two protective grid structures (8, 21),
    the motor bracket (2) and the air inlet part (3) each having a circumference with at least one first mounting flange (12) with first fastening elements (15, 16, 17) circumferentially arranged on the circumference of the motor bracket (2) and at least one second mounting flange (25) with further first fastening elements (15, 16, 17) on the circumference of the air inlet part (3), the first and second flanges being arranged at an axial distance from each other, the first fastening elements of the motor bracket (2) and of the air inlet part (3) being identical (15, 16, 17) and configured to permit an attachment of the fan unit (1) in two different orientations rotated relative to each other by 180° about an axis perpendicular to the fan axis (X-X), and
    axially extending spacers (28) being arranged on axially outward facing surfaces of protective struts or supporting struts of the grid structure and on an axially outward facing surface of a nozzle portion of the inlet part.

2. The fan unit (1) according to claim 1, further comprising that the at least one protective grid structure (8) of the motor bracket (2) has a motor mount (14) with fastening elements for attaching the fan (4).

3. The fan unit (1) according to claim 1 further comprising that at least one of the motor bracket (2) and the air inlet part (3) integrally has the cylindrical housing rim (9, 22) circumferentially attached to the at least one protective grid structure (8, 21), the cylindrical housing rim having a cylinder axis running parallel with respect to the fan axis (X-X).

4. The fan unit (1) according to claim 1 further comprising that the housing is centrally divided in the region of the cylindrical housing rim (9, 22).

5. The fan unit (1) according to claim 1 further comprising that the first fastening elements (15, 16, 17) of the first and second mounting flanges (12, 25) of the fan unit together with second fastening elements (42, 43) of the filter frame (40) form a bayonet lock.

6. The fan unit (1) according to claim 1 further comprising that the first fastening elements of the first and second mounting flanges (12, 25) consist of at least one keyhole-shaped bayonet opening (15).

7. The fan unit (1) according to claim 1 further comprising that the motor bracket (2) and the air inlet part (3) each have four mounting flanges (12, 25) which are circumferentially equally distributed at an angle of 90°.

8. The fan unit (1) according to claim 1 further comprising that the first fastening elements of the first and second mounting flanges (12, 25) have a snap-in hole (16) with an unlocking knob (17) applied to the snap-in hole (16) via a radial bar.

9. The fan unit (1) according to claim 1 further comprising that outward pointing holding struts (11, 24) that are inclined obliquely with respect to the fan axis (X-X) are configured in a radially outer region of at least one of the two protective grid structures (8, 21), so that the at least one of the two protective grid structures is configured plate-shaped, with a plate bottom protruding outward from the inlet opening (7) and the outflow opening (20), respectively.

10. The fan unit (1) according to claim 1, wherein the fan wheel is a diagonal fan wheel.

11. The fan unit (1) according to claim 1 further comprising that the motor bracket (2) has an first open connector housing part (18) and the air inlet part (3) has a second open connector housing part (26) laterally on the cylindrical housing rim (9, 22) or on one of the at least one first and second mounting flanges (12, 25) the first and second open connector housing parts forming a connector housing for receiving a plug connector of the fan unit (1).

12. The fan unit (1) according to claim 11 further comprising that the plug connector (30) is arranged inside the connector housing.

13. The fan unit (1) according to claim 1 further comprising that the filter frame (40) has second fastening elements (42) applied to at least two fastening fittings (41) and each second fastening element consists of a mushroom-shaped fastening knob (42) applied to one of the at least two mounting rims (41).

14. The fan unit (1) according to claim 1 comprising that the fastening elements of the filter frame (40) at least have one snap-in hook (43) which is applied to one of the mounting rims (41).

15. The fan unit (1) according to claim 1 further comprising that the outflow opening (7) and the cylindrical housing rim (9) of the motor bracket (2) have matching diameters, and that the inlet opening (20) has a smaller diameter than the cylindrical housing rim (22) of the air inlet part (3).

* * * * *